United States Patent
Li

(10) Patent No.: US 12,119,260 B2
(45) Date of Patent: Oct. 15, 2024

(54) METHODS FOR MANUFACTURING SEMICONDUCTOR STRUCTURES INCLUDING ISOLATION LAYER AND SEMICONDUCTOR STRUCTURES INCLUDING ISOLATION LAYER

(71) Applicant: CHANGXIN MEMORY TECHNOLOGIES, INC., Hefei (CN)

(72) Inventor: Yuan Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 549 days.

(21) Appl. No.: 17/428,058

(22) PCT Filed: Feb. 8, 2021

(86) PCT No.: PCT/CN2021/076091
§ 371 (c)(1),
(2) Date: Aug. 3, 2021

(87) PCT Pub. No.: WO2021/169794
PCT Pub. Date: Sep. 2, 2021

(65) Prior Publication Data
US 2023/0056747 A1    Feb. 23, 2023

(30) Foreign Application Priority Data
Feb. 24, 2020   (CN) .......................... 202010113773.6

(51) Int. Cl.
*H01L 21/768*    (2006.01)
*H01L 23/532*    (2006.01)

(52) U.S. Cl.
CPC .. *H01L 21/76843* (2013.01); *H01L 21/76802* (2013.01); *H01L 23/53238* (2013.01)

(58) Field of Classification Search
CPC ......... H01L 23/53238; H01L 21/76829; H01L 21/76831; H01L 21/76832; H01L 21/76843; H01L 21/76802
See application file for complete search history.

(56) References Cited

U.S. PATENT DOCUMENTS 5,695,810 A    12/1997    Dubin et al.
6,528,409 B1    3/2003    Lopatin et al.
(Continued)

FOREIGN PATENT DOCUMENTS

CN    1516895 A    7/2004
CN    100336219 C    9/2007
(Continued)

OTHER PUBLICATIONS

First Office Action and English Translation cited in CN 202010113773.6, mailed Feb. 16, 2022, 13 pages.
(Continued)

*Primary Examiner* — Laura M Menz
*Assistant Examiner* — Candice Chan
(74) *Attorney, Agent, or Firm* — Syncoda LLC; Feng Ma

(57) ABSTRACT

An embodiment of the present application relates to the technical field of semiconductors, and discloses a method for manufacturing a semiconductor structure. In this embodiment, the method comprises: providing an insulating substrate (101); depositing an isolation layer (103) on the insulating substrate (101) by a physical vapor deposition process, the isolation layer (103) comprising cobalt atoms and barrier atoms located at grain boundaries of the cobalt atoms; and depositing a copper-containing metal layer (104) on the isolation layer (103).

6 Claims, 2 Drawing Sheets

(56) References Cited

U.S. PATENT DOCUMENTS

| | | |
|---|---|---|
| 9,514,983 B2 | 12/2016 | Jezewski et al. |
| 10,049,931 B2 | 8/2018 | Yu et al. |
| 2004/0108136 A1 | 6/2004 | Andricacos et al. |
| 2006/0076244 A1 | 4/2006 | Ting et al. |
| 2015/0235953 A1 | 8/2015 | Tsao et al. |

FOREIGN PATENT DOCUMENTS

| | | | |
|---|---|---|---|
| CN | 102117796 A | 7/2011 | |
| CN | 103000570 A | 3/2013 | |
| CN | 102214621 B | 12/2014 | |
| CN | 104851874 A | 8/2015 | |
| CN | 107452711 A | 12/2017 | |
| WO | WO-2014105477 A1 * | 7/2014 | ....... H01L 21/28026 |

OTHER PUBLICATIONS

International Search Report cited in PCT/CN2021/076091 mailed Feb. 24, 2020, 9 pages.

* cited by examiner

METHODS FOR MANUFACTURING SEMICONDUCTOR STRUCTURES INCLUDING ISOLATION LAYER AND SEMICONDUCTOR STRUCTURES INCLUDING ISOLATION LAYER

The present application claims priority to Chinese Patent Application No. 202010113773.6, entitled "METHODS FOR MANUFACTURING SEMICONDUCTOR STRUCTURES AND SEMICONDUCTOR STRUCTURES", filed on Feb. 24, 2020, which is incorporated herein by reference in its entirety.

TECHNICAL FIELD

The present application relates to the technical field of semiconductors, and in particular, to a method for manufacturing a semiconductor structure and a semiconductor structure.

BACKGROUND

At present, the technology for manufacturing metal wires on semiconductor structures is increasingly mature. The width of metal wires is gradually reduced. Copper is a common metal material in metal wires. As the width of metal wires is gradually reduced, the grain size of copper becomes smaller and smaller in metal wires, so that copper atoms are easy to diffuse to the substrate to generate parasitic capacitance. In some cases, in order to avoid the generation of parasitic capacitance, a tantalum isolation layer is provided between the copper layer and the substrate to prevent the diffusion of copper atoms to the substrate.

However, the tantalum isolation layer has a poor effect in preventing the diffusion of copper atoms, and there are still many copper atoms diffused to the substrate through the tantalum isolation layer. Consequently, the service life of the semiconductor structure is reduced.

SUMMARY

The purpose of the present application is to provide a method for manufacturing a semiconductor structure and a semiconductor structure, which can effectively prevent the diffusion of copper atoms in the copper-containing metal layer to the insulating substrate, and reduce the generation of parasitic capacitance.

In order to solve the above technical problems, an embodiment of the present application provides a method for manufacturing a semiconductor structure, comprising: providing an insulating substrate; depositing an isolation layer on the insulating substrate by a physical vapor deposition process, the isolation layer comprising cobalt atoms and barrier atoms located at grain boundaries of the cobalt atoms; and depositing a copper-containing metal layer on the isolation layer.

In the embodiment of the present application, by setting the isolation layer as an isolation layer containing cobalt atoms and barrier atoms located at the grain boundaries of the cobalt atoms, so that the diffusion of copper atoms from the grain boundaries of the cobalt to the insulating substrate can be prevented, the diffusion of copper atoms in the copper-containing metal layer to the insulating substrate can be effectively prevented and the generation of parasitic capacitance can be reduced. In the embodiment of the present application, due to the relatively high adhesion between the isolation layer containing cobalt atoms and the copper-containing metal layer, the resistance to copper electron mobility is improved, and the service life of the semiconductor structure is increased; and due to the low resistivity of the isolation layer containing cobalt atoms, the performance of the semiconductor structure can be improved. In addition, since the isolation layer is deposited by the physical vapor deposition process, the isolation layer has high purity, good uniformity, and relatively stable resistance value.

In addition, a groove is formed on the insulating substrate, and the process of depositing an isolation layer on the insulating substrate comprises: depositing the isolation layer on the insulating substrate and on the bottom and the sidewalls of the groove.

In addition, the isolation layer is made of a cobalt-tungsten alloy, and the barrier atoms are tungsten atoms. By using tungsten atoms as the barrier atoms, the adhesion between the isolation layer and the copper-containing metal layer is further improved, and the resistance to electron mobility of the semiconductor structure is further improved, and the service life of the semiconductor structure is thus increased.

In addition, the content of tungsten in the cobalt-tungsten alloy is from 0.1 at % to 3.5 at %. By setting the atomic percentage of tungsten in cobalt-tungsten alloy within this range, the distribution of tungsten atoms at the grain boundaries of cobalt atoms is relatively uniform, and the prevention of the diffusion of copper atoms is better.

In addition, the temperature for depositing the isolation layer is from 150° ° C. to 350° C. Within this temperature range, the influence of the temperature on the insulating substrate can be decreased while an isolation layer with a relatively uniform thickness can be deposited.

In addition, the process of depositing a copper-containing metal layer on the isolation layer comprises: cooling the isolation layer to a temperature of from 10° ° C. to 30° C., and depositing a copper-containing metal layer at a temperature of from 10° C. to 30° C.

In addition, the flow rate of argon in the preparation environment for depositing the isolation layer is from 10 sccm to 35 sccm. Within this gas flow range of argon, the depositing of the isolation layer is fast, so the time for depositing the isolation layer is reduced.

In addition, before depositing an isolation layer, the method further comprises pre-cleaning the bottom and the sidewalls of the groove. By pre-cleaning the groove, impurities in the groove are removed. In this way, the generation of impurities during the deposition of the isolation layer is avoided, thereby reducing the resistance value of the isolation layer.

In addition, the pressure in the preparation environment for depositing the isolation layer is from 0.6 mtorr to 2 mtorr. Within this pressure range in the preparation environment, the speed at which the isolation layer is oxidized can be reduced.

In addition, the thickness of the isolation layer is from 5 nm to 20 nm. Within this thickness range of the isolation layer, the resistance to copper atom mobility is high, and within this thickness range, the resistance value of the isolation layer is also low.

BRIEF DESCRIPTION OF THE DRAWINGS

One or more embodiments will be exemplified by pictures in the corresponding drawings. These exemplified descriptions do not constitute any limitation to the embodiments. Elements with the same reference numerals in the drawings are represented as similar. Unless otherwise stated, the drawings are not necessarily drawn to scale.

DETAILED DESCRIPTION OF THE EMBODIMENTS

To make the objectives, technical schemes and advantages of the embodiments of the present application clearer, the implementations of the present application will be further described below in detail with reference to the accompanying drawings. However, it may be understood by a person of ordinary skill in the art that, in the embodiments of the present application, many technical details are provided for the better understanding of the present application. However, the technical schemes sought to be protected by the present application can be implemented, even without these technical details and various changes and modifications based on the following embodiments. The following divisions of the various embodiments are for convenience of description, and should not constitute any limitation to the specific implementation of the present application, and the various embodiments may be combined with each other if not conflict.

It can be known from the background that, in some situations, the tantalum isolation layer has a poor effect in preventing the diffusion of copper atoms, and there are still many copper atoms diffused to the substrate through the tantalum isolation layer to generate parasitic capacitance.

Figure 1:
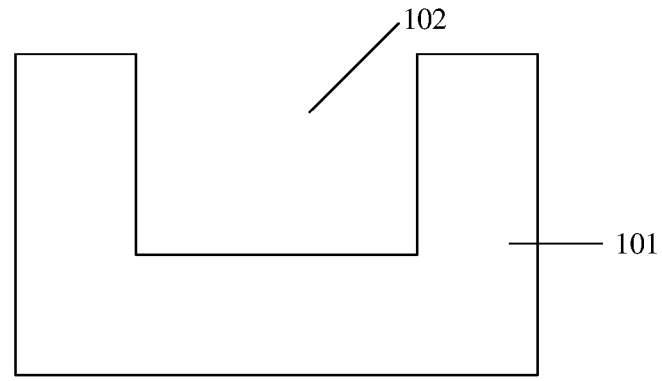
FIGS. 1 to 3 are schematic structure diagrams corresponding to steps of a method for manufacturing a semiconductor structure according to an embodiment of the present application.
Figure 2:
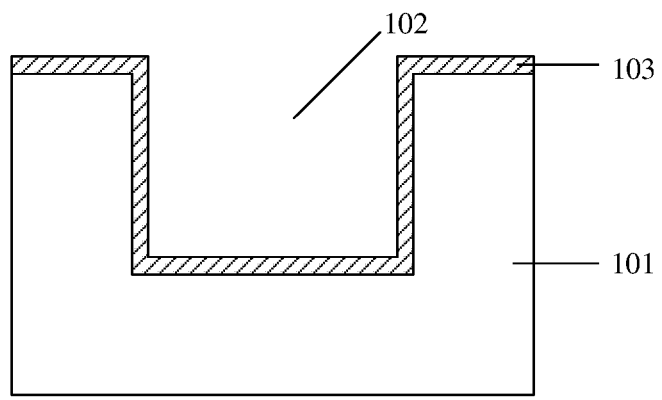
Figure 3:
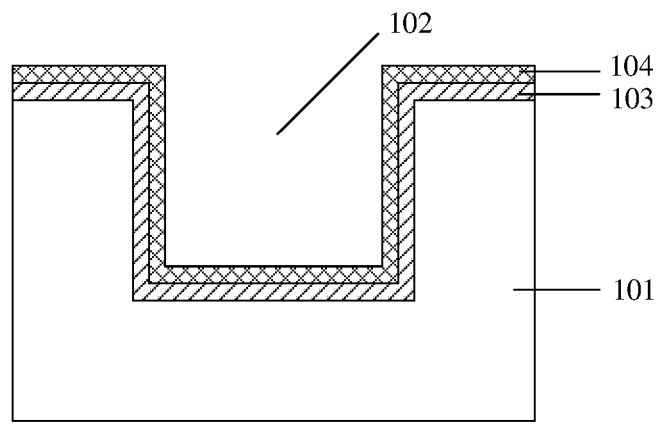
Figure 4:
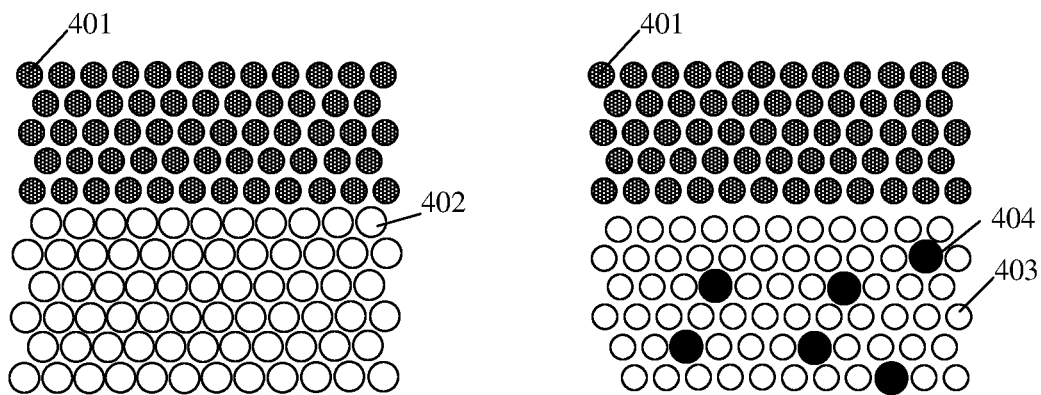
FIG. 4 is a schematic diagram of comparison of the prevention of diffusion of copper atoms between a tantalum isolation layer in the prior art and an isolation layer according to an embodiment of the present application in some situations.

In order to solve the above-mentioned problems, an embodiment of the present application relates to a method for manufacturing a semiconductor structure. FIGS. 1 to 3 are schematic structure diagrams corresponding to steps of an embodiment of the present application. FIG. 4 is a schematic diagram of comparison of the prevention of diffusion of copper atoms between a tantalum isolation layer in the prior art and an isolation layer in this embodiment of the present application.

Referring to FIG. 1, an insulating substrate 101 is provided.

In this embodiment, a groove 102 is formed on the insulating substrate 101. It should be noted that, in other embodiments, the surface of the insulating substrate 101 may be planar. The formation of the groove 102 is determined by the actual process demand on the semiconductor structure.

In one example, the insulating substrate 101 may be made of silicon oxide, silicon nitride or other insulating materials.

Referring to FIG. 2, an isolation layer 103 is deposited on the insulating substrate 101 by a physical vapor deposition process.

Specifically, the isolation layer 103 comprises cobalt atoms and barrier atoms located at the grain boundaries of cobalt atoms. Since the isolation layer 103 comprises cobalt atoms and barrier atoms located at the grain boundaries of the cobalt atoms, the diffusion of copper atoms from the grain boundaries of the cobalt to the insulating substrate 101 can be prevented, the diffusion of copper atoms in the copper-containing metal layer to the insulating substrate 101 can be effectively prevented and the generation of parasitic capacitance can be reduced.

Referring to FIG. 4, FIG. 4 is a schematic diagram of comparison of the prevention of diffusion of copper atoms between a tantalum isolation layer in the prior art and an isolation layer 103 in this embodiment. The left picture shows the prevention of diffusion of copper atoms by the tantalum isolation layer in the prior art. The right picture shows the prevention of diffusion of copper atoms by the isolation layer 103 in this embodiment. In the drawing, 401 represents copper atoms, 402 represents tantalum atoms, 403 represents cobalt atoms, and 404 represents barrier atoms. It can be found from the left picture that the grain boundaries between the tantalum atoms 402 are relatively large, and the copper atoms 401 can diffuse to the substrate through the grain boundaries between the tantalum atoms 402. It can be found from the right picture that, in this embodiment, the barrier atoms 404 are provided at the grain boundaries of the cobalt atoms 403, the diffusion of the copper atoms 401 from the grain boundaries of the cobalt atoms 403 to the insulating substrate 101 is thus prevented.

In this embodiment, the isolation layer 103 is made of a cobalt-tungsten alloy, and the barrier atoms are tungsten atoms. In other embodiments, the isolation layer 103 is made of a cobalt-molybdenum alloy, and the barrier atoms are molybdenum atoms.

In one example, the content of tungsten in the cobalt-tungsten alloy is from 0.1 at % to 3.5 at %, for example, 0.5 at %, 1 at %, 1.5 at %, 2 at %, 2.5 at %, 3 at %. Using the cobalt-tungsten alloy having a content of tungsten atoms within this range, the distribution of tungsten in the cobalt is relatively uniform, and the prevention of diffusion of copper is better.

In this embodiment, since the groove 102 is formed on the insulating substrate 101, the process of depositing the isolation layer 103 on the insulating substrate 101 specifically comprises: depositing the isolation layer 103 on the insulating substrate 101 and on the bottom and the sidewalls of the groove 102.

In this embodiment, since impurities in the groove 102 will increase the resistance value of the isolation layer 103 and affect the performance of the semiconductor structure, in order to reduce the resistance value of the isolation layer 103 and to improve the cleanliness of the interior of the groove 102 to prevent the residual impurities in the groove 102 from affecting the resistance value of the isolation layer 103, the bottom and sidewalls of the groove 102 may be pre-cleaned before the isolation layer 103 is deposited. That is, the bottom and sidewalls of the groove 102 are bombarded by argon ions to remove impurities in the groove 102. By pre-cleaning the groove 102, impurities in the groove 102 are removed, the purity of the isolation layer 103 is improved, the resistance value of the isolation layer 103 is reduced, and the performance of the semiconductor structure is improved.

In one example, the temperature for depositing the isolation layer 103 is from 150° C. to 350° C., for example, 200° C., 250° C., 300° C. With this temperature range, due to this low temperature, the influence of the temperature on the substrate 101 can be decreased while an isolation layer 103 with a relatively uniform thickness can be deposited. This avoids damages to the substrate 101 and the influence on the performance of the semiconductor structure. In addition, within this temperature range, compared to the CVD (Chemical Vapor Deposition) process, the PVD (Physical Vapor Deposition) process can deposit the isolation layer 103 at a lower temperature, which reduces the process cost.

In one example, the operating power in the preparation environment for depositing the isolation layer 103 is from 2000 W to 4000 W, for example, 2500 W, 3000 W, or 3500 W. Within this power range, the deposited isolation layer 103 is relatively uniform in thickness.

In one example, the flow rate of argon in the preparation environment for depositing the isolation layer is from 10 sccm to 35 sccm, for example, 15 sccm, 20 sccm, or 30 sccm. Within this gas flow range of argon, the depositing of the isolation layer 103 is fast, so the time for depositing the isolation layer 103 can be reduced. Therefore, the preparation time is reduced.

In one example, the pressure in the preparation environment for depositing the isolation layer 103 is from 0.6 mtorr to 2 mtorr, for example, 0.8 mtorr, 1 mtorr, 1.3 mtorr, 1.5 mtorr, or 1.8 mtorr. The higher the pressure is, the faster the oxidation reaction is. By controlling the pressure in the preparation environment within this range, the pressure is relatively low and the oxidation speed of the isolation layer is slowed down.

In one example, the thickness of the isolation layer 103 is from 5 nm to 20 nm, for example, 10 nm, 12 nm, 15 nm, or 17 nm. Within this thickness range of the isolation layer 103, the resistance of the isolation layer 103 to copper atom mobility is high, and within this thickness range, the resistance value of the isolation layer 103 is also low. Meanwhile, the size of the semiconductor structure can be reduced.

Referring to FIG. 3, a copper-containing metal layer 104 is deposited on the isolation layer 103.

In this embodiment, the isolation layer 103 is deposited at a temperature of from 150° C. to 350° C. and the temperature required for depositing the copper-containing metal layer 104 is relatively low. Therefore, after the isolation layer 103 is deposited, the isolation layer 103 is cooled to a temperature of from 10° C. to 30° C., for example, 15° C., 20° C., or 25° C., and the copper-containing metal layer 104 is deposited at this temperature. By cooling, the hardness of the isolation layer 103 is increased, thereby improving the performance of the semiconductor structure.

It should be noted that, since the isolation layer 103 contains cobalt atoms, and due to the relatively high adhesion between the isolation layer 103 and the copper-containing metal layer 104, the resistance of the isolation layer 103 to copper electron mobility can be improved, and the service life of the semiconductor structure can be increased. And, since the resistivity of the cobalt-containing alloy is lower than that of tantalum, the resistance value of the isolation layer can be reduced and the performance of the semiconductor structure can be improved.

Figure 5:
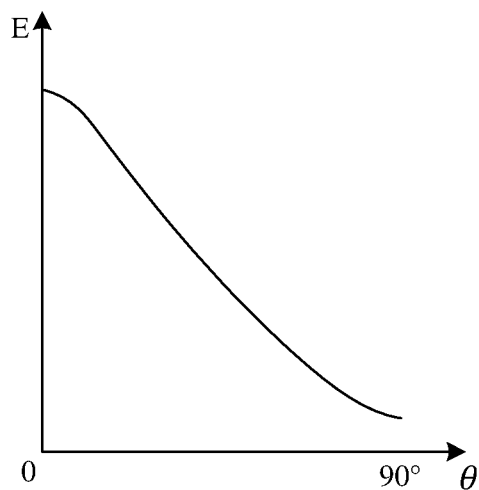
FIG. 5 is a graph of the adsorption energy E & the wetting angle θ in an embodiment of the present application.

Referring to FIG. 5, which is a graph of the adsorption energy E & the wetting angle θ, the abscissa represents the wetting angle, that is, an angle between the tangent of copper atoms at a contact point of the copper metal layer 104 with the isolation layer 103 and the surface of the isolation layer; and the ordinate represents the adsorption energy E, where the greater the adsorption energy E, the higher the adhesion, and vice versa. It can be found from FIG. 5 that, the larger the wetting angle θ, the less the adsorption energy E. The wetting angle θ between the copper-containing metal layer 104 and the tantalum isolation layer 103 is 67°±10°, and the wetting angle θ between the copper-containing metal layer 104 and the isolation layer 103 containing cobalt atoms is 55°+10°. It can be known that, compared with the adhesion between the tantalum isolation layer 103 and the copper-containing metal layer 104, the adsorption energy E between the copper-containing metal layer 104 and the isolation layer 103 containing cobalt atoms is greater, and accordingly, the adhesion is higher.

In one example, the copper-containing metal layer 104 is made of copper, aluminum-copper alloy or other copper-containing alloys.

In this embodiment, the copper-containing metal layer 104 is deposited by a physical vapor deposition process. In other embodiments, the copper-containing metal layer 104 is deposited by a chemical vapor deposition process.

In this embodiment, by setting the isolation layer as an isolation layer containing cobalt atoms and barrier atoms located at the grain boundaries of the cobalt atoms, the diffusion of copper atoms from the grain boundaries of the cobalt to the insulating substrate can be prevented, the diffusion of copper atoms in the copper-containing metal layer to the insulating substrate can be effectively prevented and the generation of parasitic capacitance can be reduced. Compared with the use of tantalum metal as the isolation layer in the prior art, due to the relatively high adhesion between the isolation layer containing cobalt atoms and the copper-containing metal layer, the resistance to copper electron mobility is improved, and the service life of the semiconductor structure is increased; and due to the low resistivity of the isolation layer containing cobalt atoms, the performance of the semiconductor structure can be improved. In addition, since the isolation layer is deposited by the physical vapor deposition process, the isolation layer has high purity, good uniformity, and relatively stable resistance value.

The division of the steps of the various methods above is just for clarity of description. When implemented, the steps may be combined into one step or some steps may be split and decomposed into multiple steps, as long as they include the same logical relationship, without departing from the scope of the present application. Adding insignificant modifications to the process or introducing insignificant designs without changing the algorithm and the key design of the process are within the protection scope of the present application.

Correspondingly, another embodiment of the present application relates to a semiconductor structure, which is prepared according to the method for manufacturing a semiconductor structure described in the above embodiment. Referring to FIG. 3, FIG. 3 is a schematic diagram of the semiconductor structure according to this embodiment.

It should be noted that this embodiment corresponds to the above embodiment, and the related technical details mentioned in the above embodiment are still valid in this embodiment and, for simplicity, will not be repeated here.

It may be understood by a person of ordinary skill in the art that the above embodiments are specific embodiments for realizing the present application, and in actual applications, various changes may be made to the form and details without departing from the spirit and scope of the present application.

The invention claimed is:
1. A method for manufacturing a semiconductor structure, comprising:
   providing an insulating substrate;
   depositing an isolation layer on the insulating substrate by a physical vapor deposition process, the isolation layer comprising cobalt atoms and barrier atoms located at grain boundaries of the cobalt atoms; and
   depositing a copper-containing metal layer on the isolation layer, wherein the isolation layer is made of a cobalt-tungsten alloy, and the barrier atoms are tungsten atoms;

wherein a content of tungsten in the cobalt-tungsten alloy is from 0.1 at % to 3.5 at %;

wherein a temperature for depositing the isolation layer is from 150° C. to 350° C.;

wherein the depositing a copper-containing metal layer on the isolation layer comprises:

cooling the isolation layer to a temperature of from 10° C. to 30° C., and depositing the copper-containing metal layer at a temperature of from 10° ° C. to 30° C.

2. The method for manufacturing a semiconductor structure according to claim 1, wherein a groove is formed on the insulating substrate, and the-depositing an isolation layer on the insulating substrate comprises:

depositing the isolation layer on the insulating substrate and on a bottom and sidewalls of the groove.

3. The method for manufacturing a semiconductor structure according to claim 2, wherein, before the depositing an isolation layer, further comprising:

pre-cleaning the bottom and the sidewalls of the groove.

4. The method for manufacturing a semiconductor structure according to claim 1, wherein a flow rate of argon in a preparation environment for depositing the isolation layer is from 10 sccm to 35 sccm.

5. The method for manufacturing a semiconductor structure according to claim 1, wherein a pressure in a preparation environment for depositing the isolation layer is from 0.6 mtorr to 2 mtorr.

6. The method for manufacturing a semiconductor structure according to claim 1, wherein a thickness of the isolation layer is from 5 nm to 20 nm.

* * * * *